United States Patent [19]

Upadhyayula

[11] 4,086,501
[45] Apr. 25, 1978

[54] PLANAR TRANSFERRED ELECTRON LOGIC DEVICE WITH IMPROVED BIASING MEANS

[75] Inventor: Lakshminarasimha Chainulu Upadhyayula, East Windsor, N.J.

[73] Assignee: RCA Corporation, New York, N.Y.

[21] Appl. No.: 750,400

[22] Filed: Dec. 14, 1976

[51] Int. Cl.² .................. H01L 27/04; H03K 3/26
[52] U.S. Cl. .................. 307/299 R; 357/3; 331/107 G; 307/213
[58] Field of Search .................. 357/15, 3, 4; 307/299 R, 213; 331/107 G

[56] References Cited

U.S. PATENT DOCUMENTS

| | | | |
|---|---|---|---|
| 3,566,306 | 2/1971 | Esposito et al. | 357/3 X |
| 3,588,736 | 6/1971 | McGroddy | 357/3 X |
| 3,706,014 | 12/1972 | Dean | 357/15 |
| 3,959,807 | 5/1976 | Upadhyayula et al. | 357/3 |
| 3,991,328 | 11/1976 | Upadhyayula et al. | 307/299 R |

*Primary Examiner*—John S. Heyman
*Attorney, Agent, or Firm*—H. Christoffersen; Joseph D. Lazar; Robert M. Rodrick

[57] ABSTRACT

A planar transferred electron logic device comprising a substrate of substantially insulating material and a layer of semiconductor material which exhibits a differential negative resistance through the "transferred electron effect" upon application of an electric field above threshold level. Spaced anode, cathode and gate terminals are located on the semiconductor layer. The anode and cathode terminals are biased slightly below threshold creating thereby a reverse bias on the gate terminal. An input signal is applied to the gate terminal to trigger the device causing the formation of domains. The terminals are biased by an improved biasing circuit to reduce the magnitude of the reverse bias and the input signal to enhance the trigger sensitivity and stability of the device.

4 Claims, 5 Drawing Figures

PLANAR TRANSFERRED ELECTRON LOGIC DEVICE WITH IMPROVED BIASING MEANS

The Government has rights in this invention pursuant to Contract No. N00014-75-C-0100 awarded by the Department of the Navy.

BACKGROUND OF THE INVENTION

1. Field of the Invention

This invention relates to a semiconductor device and more particularly to a planar transferred electron logic device (TELD) having improved biasing means for enhancing the device sensitivity and stability.

2. Description of the Prior Art

Planar transferred electron logic devices, also referred to as Gunn devices, offer switching speeds on the order of 20 to 50 pico-seconds with delay — dissipation products of 1 to 2 pico-joules. Such speeds are not practicable with CMOS (Complementary MOS) or ECL (Emitter Coupled Logic) devices. Such planar transferred electron devices are particularly useful for performing gigabit rate signal processing and Fast Fourier Transforms (FFT).

Planar transferred electron devices typically comprise a body of semiconductor material such as gallium arsenide which exhibits the "transferred electron effect", an effect well known and exhibited in Gunn devices, and the like. For further details on the transferred electron effect, see U.S. Pat. No. 3,991,328 issued Nov. 9, 1976 and U.S. Pat. No. 3,700,014 issued Dec. 12, 1972. This material has a length, thickness and doping density such that the body is characterized by a transfer of electrons from a high to a low mobility sub-band and the formation of domains in the presence of a suitable biasing potential above threshold. Such devices usually have a product of length (L) times the doping density ($n$) or nL product greater than $1 \times 10^{13}$ cm$^{-2}$ and a doping density times thickness that is greater than $1 \times 10^{12}$ cm$^{-2}$. A cathode terminal is located on the top surface of the body near one end and a anode terminal is located on the top surface of the body near the end opposite the cathode end.

In the prior art devices, the biasing potential across the cathode and anode terminal is determined in the quiescent state at a value slightly below that of threshold. A typical device is operated from 0.9 to 0.95 times threshold. A gate electrode is located close to the cathode. When input signals applied to the gate electrode are of sufficient magnitude to increase the value of the electric field under the gate to a value above that of threshold, domains are formed and the device changes state from a relatively high current state to a low current state.

It is often desirable to cascade transferred electron logic devices in logic circuits to meet various circuit requirements. If the output of the logic device is of the same polarity as the input to which it is connected, these devices can be cascaded without additional invertors after each stage. To achieve an output polarity the same as that of the input, a load resistor connected to the cathode terminal is required. However, the utilization of such a load resistor connected to the cathode terminal disadvantageously degrades the trigger sensitivity and stability of the device since the load resistor creates a larger reverse bias on the gate terminal than without the load resistor.

SUMMARY OF THE INVENTION

According to the present invention, a semiconductor device having predetermined levels of trigger sensitivity and stability comprises a substrate of substantially insulating material and a relatively thin layer of semiconductor material. The layer of semiconductor material exhibits a differential negative resistance through the transferred electron effect characterized by a transfer of electrons from a high to a low mobility sub-band and the formation of domains upon the application of an electric field above threshold. Spaced anode, cathode and gate terminals are located on the semiconductor layer. The device includes means for applying across the anode and cathode terminals a first potential having a magnitude below the threshold value, the first potential creating a reverse bias on the gate terminal. Included is means for applying an input trigger signal of predetermined magnitude and polarity to the gate terminal so as to increase the electric field under the gate to exceed the threshold value causing thereby the formation of domains. A load resistor is serially connected to the cathode terminal to provide a device output pulse having the same polarity as the input trigger signal. The device includes biasing means across the cathode terminal for reducing the magnitude of the reverse bias on the gate and the magnitude of the input trigger signal to enhance the trigger sensitivity and stability of the device.

DETAILED DESCRIPTION OF THE PREFERRED EMBODIMENT

Figure 1:
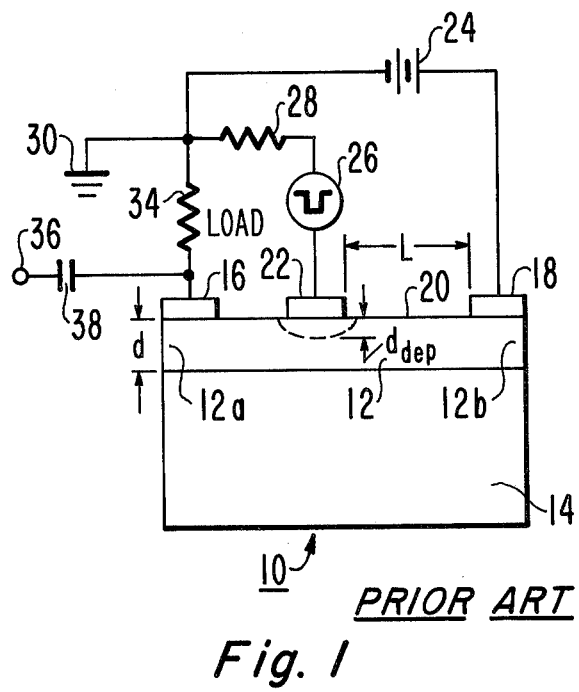
FIG. 1 is a schematic representation of a planar transferred electron device with biasing circuitry according to the prior art.

Referring to the drawing, there is shown in FIG. 1 a planar transferred electron logic device 10 according to the prior art. Device 10 comprises a broad relatively thin layer 12 of semiconductor material on a substrate 14 of semi-insulating material. Layer 12 is a semiconductor material which exhibits a differential negative resistance through the transferred electron effect, such as gallium arsenide and other III-V compounds or mixtures of such compounds. Semi-insulating substrate 14 may be gallium arsenide having a resistivity on the order of $10^6$ to $10^8$ ohm-cm. The material of layer 12 has, for example, a doping density of $1 \times 10^{16}$ cm$^{-3}$, and a selected thickness and length so that, with its doping density, the device will operate as a planar transferred electron logic device.

Figure 2:
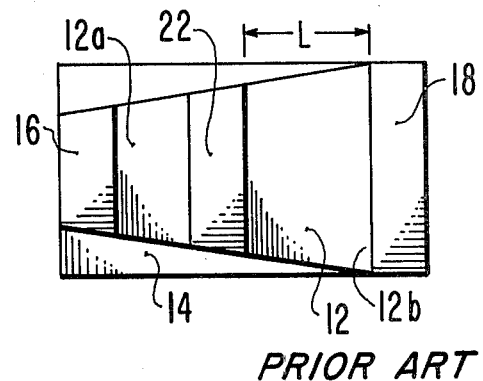
FIG. 2 is a top plan view of the configuration shown in FIG. 1.

A cathode terminal 16 and an anode terminal 18 are provided in spaced relation on the top surface 20 of semiconductor layer 12. Terminals 16 and 18 may be a film of an electrically conductive metal, or alloy to provide ohmic contacts with layer 12. Cathode terminal 16 is located near one end 12a of layer 12 and anode terminal 18 is located near the opposite end 12b of layer 12. Layer 12 is narrower near the cathode end 12a and broadens out linearly to the anode end 12b. The anode end is, for example, about 1.5 times as wide as the cathode end. (See FIG. 2). In the operation of the device, the electric fields are greater at the anode end. These fields can be so great that the metal at anode terminal 18 can migrate into the semiconductor layer 12. By expanding the width of layer 12 near the anode terminal 18, the high electric fields are reduced and such metal migration is minimized.

A gate terminal 22 is provided on the top surface 20 of semiconductor layer 12 between terminals 16 and 18 and more proximate the cathode terminal 16. Gate terminal 22 may be of a metal such as chromium which will form a Schottky barrier junction with semiconductor layer 12 or may be of a semiconductor material of a conductivity type opposite to that of semiconductor layer 12 so as to provide a P-N junction between gate terminal 22 and semiconductor layer 12. In the configuration illustrated in FIG. 1, the length L is the length between gate terminal 22 and anode terminal 18. This length for a material with a doping density at $2 \times 10^{16}$ cm$^{-3}$ must be greater than about $0.5 \times 10^{-3}$ cm to maintain the critical nL product greater than $1 \times 10^{13}$ cm$^{-2}$. For a particular device using this material, a length L of $1.0 \times 10^{-3}$ cm has been selected. The thickness (d) of layer 12 must be greater than about $0.5 \times 10^{-4}$ cm to maintain the critical nd product of greater than $1 \times 10^{12}$ cm$^{-2}$. For the particular device selected, the material thickness was about $2 \times 10^{-4}$ cm. To achieve the transfer of electrons from the high mobility to the low mobility sub-band and to cause formation of domains, this material must be biased above the threshold voltage. The threshold field (threshold voltage divided by cathode to anode length) for GaAs material is on the order of 3.2 to 3.5 kilovolts per cm. A lesser field of, for example, 2.2 kilovolts per cm is all that is required to sustain domains when formed.

A biasing field is provided by battery 24 which has its negative terminal connected to ground terminal 30 and has its positive terminal connected to anode terminal 18. The cathode terminal 16 is returned to the ground terminal 30 through a load resistor 34. The biasing voltage selected, for example, is about 0.9 times that of threshold value. At this voltage level across the device, domains are not formed but are sustained when formed. Application of the biasing field by battery 24 also produces a reverse bias on gate terminal 22, the reverse bias being caused by the voltage drop across the load resistor 34 and the built in potential at the gate junction.

A negative pulse to trigger the device is supplied to gate terminal 22 by an input signal source 26 serially connected to a resistor 28 (which is generally the output impedance of source 26) and to ground potential 30. Input signals for the logic device 10 are pulses but may be for example continuous wave (cw) depending on the application of the device. The signals applied to gate terminal 22 cause an increase in depletion region, $d_{dep}$ (see FIG. 1), and thus, an increase in the electric field in the region below gate terminal 22. The level of the negative pulse applied to the gate terminal 22 is of a sufficient magnitude that when combined with the voltage applied by battery 24 an electric field is created under gate terminal 22 that exceeds the threshold value whereby domains are generated. When the device is triggered by applying the external signal, the device current drops and the voltage across the cathode terminal 16 and anode terminal 18 increases.

Load resistor 34 is utilized to provide an output pulse having the same polarity as that of the input pulse as applied by signal source 26. Connecting a load resistor between the positive terminal of battery 24 and anode terminal 18 would provide an output pulse having a polarity opposite to that of the input pulse. By arranging device 10 to have its output polarity the same as the polarity of the input, device 10 can be cascaded with other logic devices without additional invertors. For gain considerations the value of load resistor 34 is selected to be about the same value as the device low field resistance. Thus, the voltage drop across the load resistor is the same as the voltage drop across the device. This value of load resistor 34 determines the magnitude of the input signal required to trigger the device. The output of device 10 may be taken from terminal 36 through capacitor 38.

The use of load resistor 34 connected to cathode terminal 16 and the associated voltage drop creates a larger reverse bias on gate terminal 22 upon application of the biasing field by battery 24 than with the load resistor connected to anode terminal 18. Also the utilization of such a cathode connected load resistor 34 causes a larger depletion region, $d_{dep}$, under gate terminal 22. Consequently the device performance is affected in two ways: first, a larger input signal is required to cause domain formation; secondly, the electric field under the gate is much larger compared to the rest of the channel, such nonuniformity of electric field decreasing the device stability and also reducing the output voltage. When the anode bias provided by battery 24 is increased by a small voltage, most of this increase is absorbed by the gate region and the electric field in that gate region may quickly rise to the threshold level causing instability of the device.

Figure 3:
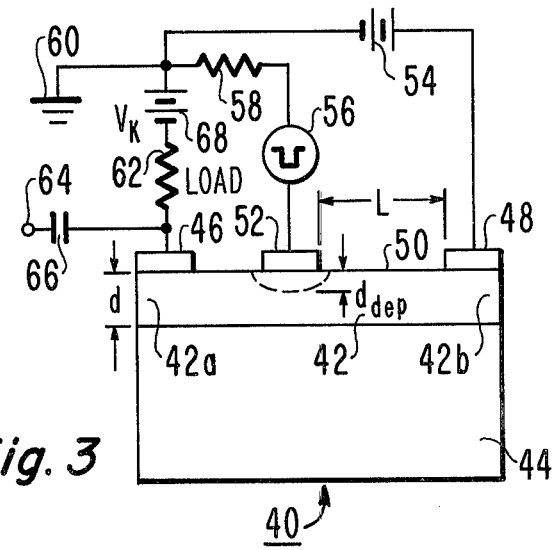
FIG. 3 is a schematic representation of a planar transferred electron device with biasing circuitry according to one embodiment of the present invention.

Referring now to FIG. 3, there is shown a planar transferred electron logic device 40 in accordance with the present invention with improved biasing circuitry to reduce the magnitude of the reverse bias and thereby the magnitude of the input trigger signal to enhance the trigger sensitivity and stability of device 40. A layer 42 of n-type gallium arsenide is grown on a substrate 44 of semi-insulating material. Layer 42 and substrate 44 are similar to those described previously in the prior art detailed in FIG. 1. A conductive cathode terminal 46 is located on the top surface 50 of layer 42 and near one end 42a of layer 42. A conductive anode terminal 48 is located at the opposite end 42b of layer 42. Layer 42 may be tapered as is layer 12 in FIG. 2. A gate terminal 52 which may be a Schottky barrier junction or a P-N junction is located near cathode terminal 46. For example, the spacing, L, between gate terminal 52 and anode terminal 48 is $1.0 \times 10^{-3}$ cm. The spacing between cathode terminal 46 and anode terminal 48 is about $1.2 \times 10^{-3}$ cm.

A battery 54 has its negative terminal connected to ground terminal 60 and its positive terminal connected to anode terminal 48 to provide a biasing field to device 40, such a biasing field creating a reverse bias on gate terminal 52. The biasing voltage selected is, for example, about 0.9 times that of threshold.

An input negative signal is applied to gate terminal 52 by an input signal source 56 serially connected to a resistor 58 and to ground potential 60. A load resistor 62 is serially connected to the cathode terminal 46 to provide an output pulse having the same polarity as the polarity of the input signal. The output may be taken at terminal 64 through a capacitor 66. Serially connected to load resistor 62 and hence to cathode terminal 46 is a battery 68 having its negative terminal connected to load resistor 62 and its positive terminal connected to ground terminal 60. The voltage of battery 68 may be expressed as $$V_k = R_L I_{th} \qquad (1)$$

where $I_{th}$ is the device threshold current under operating conditions and $R_L$ is the value of the load resistance, the value of $R_L$ being determined by gain and output considerations. When selected in this manner, the cathode terminal is virtually at ground potential and the presence of the load resistor 62 for biasing purposes is effectively negated. Domains are not formed in the device in this biasing arrangement but are sustained at this level when formed. Under these conditions, the device can be triggered into operation by application of the negative input signal having a lower magnitude than that required in the prior art thus improving the trigger sensitivity of the device. Also, in a particular prior art device the magnitude of the reverse bias on the gate is about 5-6 volts whereas the magnitude of the reverse bias of the present invention having similar materials, doping densities and dimensions as the prior art device is less than 1 volt. The reverse bias voltage of the present invention is determined by the built-in potential of the device itself, the value of the load resistor not contributing to the magnitude of the reverse bias. Due to the smaller reverse bias on the gate, the depletion region, $d_{dep}$, beneath gate terminal 52 is much smaller than that of the prior art and hence the electric field in that region is low. The electric field throughout layer 42 is thereby more uniform that the prior art device, such greater uniformity of electric field contributing to improved stability of the device.

Figure 4:
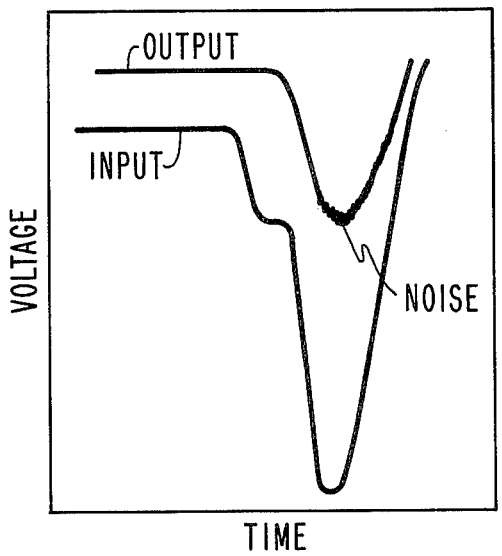
FIG. 4 is a graph showing input and output voltages varying with time according to the prior art device shown in FIG. 1.
Figure 5:
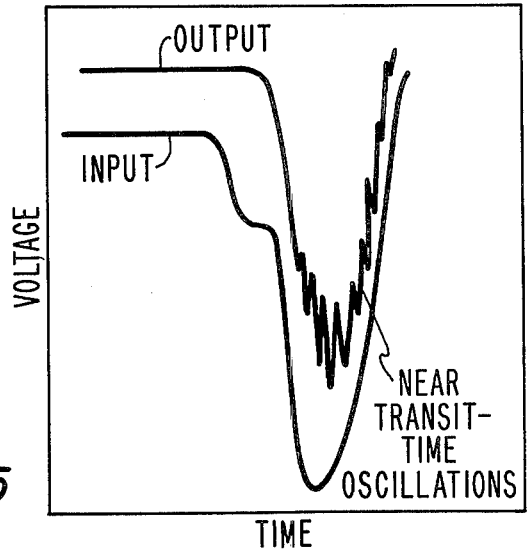
FIG. 5 is a graph showing input and output voltages varying with time in accordance with the present invention.

The effect of the improved biasing circuitry can be seen by comparing the graphs of the input-output voltages of the prior art devices shown in FIG. 4 with the voltages of the present invention shown in FIG. 5. In FIG. 5, the output pulse is of the same polarity as the input pulse and about the same magnitude and exhibits near transit time oscillations which are characteristic of the transferred electron device. In comparison, as illustrated in FIG. 4, the magnitude of the output pulse of the prior art devices is somewhat less than the magnitude of the input pulse and exhibits noisy rather than near transit time oscillations. In this case also, the polarity of the output is same as that of the input.

The virtual grounded cathode configuration described above is particularly useful in an environment in which more than one input to the gate terminal is needed to connect, for example, clocks, split gates or dual gates. The output is changing around near zero potential and voltage level shifting devices are not needed.

What is claimed is:

1. In a semiconductor planar transferred electron device of the type having predetermined levels of trigger sensitivity and stability and comprising a substrate of substantially insulating material, a relatively thin layer of a semiconductor material which exhibits a differential negative resistance through the transferred electron effect characterized by a transfer of electrons from a high to a low mobility sub-band and the formation of domains upon the application of an electric field above threshold, spaced anode and cathode terminals engaging said semiconductor layer, a gate terminal on said semiconductor layer, means for applying across said anode and cathode terminals a first potential having a magnitude below said threshold value, said first potential creating a reverse bias on said gate terminal, means for applying an input trigger signal of a predetermined magnitude and polarity to said gate terminal, said input trigger signal increasing the electric field of said first potential to exceed said threshold value causing thereby the formation of said domains, a load resistor serially connected to said cathode terminal to provide a device output pulse having the same polarity as said input trigger signal, wherein the improvement comprises:
   means for biasing said cathode terminal to reduce the magnitude of said reverse bias on said gate terminal thereby reducing the magnitude of said input trigger signal and enhancing the trigger sensitivity and stability of said device, said reduced input trigger signal being sufficient to combine with said first potential to form said domains.

2. The device according to claim 1, wherein the means for applying a first potential includes a first d.c. potential source of a first polarity and wherein said means for biasing said cathode terminal includes a second d.c. potential source of a polarity the reverse of said first polarity, said second d.c. potential source being serially connected to said load resistor and thereby to said cathode terminal to provide a virtual ground potential at said cathode terminal for reducing the magnitude of said reverse bias and said input trigger signal.

3. A semiconductor device according to claim 1, wherein said gate terminal is of a metal forming a Schottky barrier junction with said semiconductor layer.

4. A semiconductor device according to claim 1, wherein said gate terminal is of a semiconductor material forming a PN junction with said semiconductor layer.

* * * * *